United States Patent
Sunwoo et al.

(10) Patent No.: US 7,936,615 B2
(45) Date of Patent: May 3, 2011

(54) METHODS FOR SUPPLYING POWER SUPPLY VOLTAGES IN SEMICONDUCTOR MEMORY DEVICES AND SEMICONDUCTOR MEMORY DEVICES USING THE SAME

(75) Inventors: Jung Sunwoo, Seoul (KR); Yun-Sang Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 339 days.

(21) Appl. No.: 12/071,348

(22) Filed: Feb. 20, 2008

(65) Prior Publication Data

US 2009/0067217 A1   Mar. 12, 2009

(30) Foreign Application Priority Data

Feb. 27, 2007   (KR) .................. 10-2007-0019599

(51) Int. Cl.
*G11C 5/14* (2006.01)
(52) U.S. Cl. .............. 365/189.09; 365/185.18; 365/149; 365/210.12
(58) Field of Classification Search .............. 365/149, 365/189.09, 185.18, 210.12
See application file for complete search history.

(56) References Cited

U.S. PATENT DOCUMENTS

| 6,449,208 B1 * | 9/2002 | Kono et al. ................ 365/226 |
| 2008/0062800 A1 * | 3/2008 | Chi ............................. 365/226 |

FOREIGN PATENT DOCUMENTS

| JP | 09-7376 | 1/1997 |
| KR | 10-0164816 | 9/1998 |
| KR | 10-0215734 | 5/1999 |
| KR | 10-20010060811 | 7/2001 |
| KR | 2001-0057487 | 7/2001 |
| KR | 10-20050119482 | 12/2005 |

OTHER PUBLICATIONS

Korean Office Action dated Jan. 24, 2008, issued in corresponding Application No. KR 10-20070019599.

* cited by examiner

*Primary Examiner* — Hoai V Ho
*Assistant Examiner* — Anthan T Tran
(74) *Attorney, Agent, or Firm* — Harness, Dickey & Pierce, P.L.C.

(57) ABSTRACT

In a method for supplying power supply voltages in a semiconductor memory device a first source voltage is applied to a memory cell of a memory cell array as a cell array internal voltage for operating a sense amplifier coupled to the memory cell. A second source voltage is applied as a word line drive voltage of the memory cell array. The second source voltage has a voltage level higher than a voltage level of the first source voltage. The second source voltage is also applied as a drive voltage of an input/output line driver to drive write data into an input/output line in a write operating mode.

20 Claims, 7 Drawing Sheets

METHODS FOR SUPPLYING POWER SUPPLY VOLTAGES IN SEMICONDUCTOR MEMORY DEVICES AND SEMICONDUCTOR MEMORY DEVICES USING THE SAME

PRIORITY STATEMENT

This U.S. non-provisional patent application claims priority under 35 U.S.C. §119 to Korean Patent Application 10-2007-0019599 filed on Feb. 27, 2007, in the Korean Intellectual Property Office (KIPO), the entire contents of which is hereby incorporated by reference.

BACKGROUND

Description of the Related Art

As related art semiconductor memory devices become more integrated and/or capable of operating at higher speeds, internal voltages need to be decreased inside a chip to provide appropriate power consumption and/or reliability. Thus, an internal voltage generating circuit capable of lowering external voltages having a relatively high level and generating an internal voltage necessary for operation of a semiconductor memory device may be needed. In a conventional semiconductor memory device such as DRAM, an internal voltage down converter may be used. The internal voltage down converter may convert an external voltage and supply the internal voltage having a given level to circuits inside a chip.

Among the internal voltage generating circuits, a cell array voltage generating circuit may generate a power supply voltage for a bit line connected to a memory cell. A peripheral circuit voltage generating circuit may generate a power supply voltage necessary for peripheral circuits, but not a cell core circuit.

FIG. 1 is a block diagram of conventional dynamic random access memory (hereinafter, referred to as "DRAM"). Referring to FIG. 1, a conventional DRAM may include a memory cell array 20, a control circuit 9, a buffer and decoder 50, a write path circuit 30 and a read path circuit 40. A cell core circuit, which may be disposed adjacent to the memory cell array 20 and include a bit line sense amplifier, may be driven by a cell array voltage generated in the cell array voltage generating circuit. A peripheral circuit may be driven by a peripheral circuit voltage generated in the peripheral circuit voltage generating circuit. The peripheral circuit may be disposed near a chip, away from the memory cell array 20. The peripheral circuit may include the buffer and decoder 50, the write path circuit 30 and the read path circuit 40.

FIG. 2 is a circuit diagram illustrating a portion of the DRAM shown in FIG. 1. Referring to FIG. 2, a first voltage generator 100 may apply a peripheral circuit voltage V1 to a global input/output driver 230 of the write path circuit 30. A second voltage generator 90 may apply a cell array voltage V2 to a sense amplifier 6 of a cell core circuit 10. A third voltage generator 110 may perform a relatively high voltage pumping operation to apply a voltage (e.g., a high or relatively high voltage) VPP to an access transistor of a memory cell 8. The cell core circuit 10 may further include a column selection gate 5. The DRAM may further include a local global multiplexer 220.

As conventional DRAMs become relatively low power devices, external and peripheral circuit voltages for driving the peripheral circuit may decrease. A cell array voltage V2 for driving the memory cell array 20 may also decrease. To write data to memory cell 8, the cell array voltage V2 may be lower than the peripheral circuit voltage V1. However, as integration increases and/or power consumption decreases, operating voltage V1 may decrease, and thus, it may be more difficult to lower the cell array voltage V2 to be lower than the peripheral circuit voltage V1. In addition, lowering a threshold voltage of the memory cell transistor 8 may be limited.

Moreover, once the cell array voltage V1 is reduced, a memory cell driving capability of a sense amplifier connected to a bit line may weaken in a write operation. As a result, write speed may decrease.

SUMMARY

Example embodiments provide power supply voltage supply methods for integrated semiconductor memory devices capable of further reducing cell array voltages, and semiconductor memory devices using the same. Example embodiments may increase reliability and/or writing speeds.

According to at least some example embodiments, a write operation may be relatively high speed and/or more reliable even in a more highly integrated semiconductor memory device.

At least one example embodiment provides a DRAM, in which a cell array voltage and a peripheral circuit voltage are used with the same or substantially the same voltage level and a portion of write path circuit uses a relatively high voltage applied internally or externally.

At least one example embodiment provides a method of supplying a power supply voltage in a semiconductor memory device. According to at least this example embodiment, a first source voltage may be applied as a cell array internal voltage for operating a sense amplifier coupled to a memory cell of a memory cell array. A second source voltage may be applied as a word line drive voltage of the memory cell array. The second source voltage may be higher than the first source voltage. The second source voltage may be applied as a drive voltage of input/output line driver to drive write data into an input/output line in a write operating mode.

According to at least some example embodiments, the second source voltage may be an external voltage applied outside or an internal relatively high voltage generated through a relatively high voltage pumping circuit. The external voltage may be a voltage higher than a level of the applied external voltage. The input/output line driver may be a global input/output line driver.

At least one other example embodiment provides a method of supplying a power supply voltage in a dynamic random access memory capable of receiving first and second external voltages having different levels. According to at least this example embodiment, a first source voltage may be applied to a peripheral circuit block and a core circuit block. The first source voltage may be lower than a level of the first external voltage. The second external voltage may be applied as a drive voltage of write path circuit to drive write data into an input/output line in a write operating mode. The second external voltage may be higher than a level of the first external voltage.

At least one other example embodiment provides a semiconductor memory device. According to at least this example embodiment, the semiconductor memory device may include a memory cell array having a plurality of memory cells. The plurality of memory cells may be arrayed in a matrix of rows and columns. The plurality of memory cells may include an access transistor and a storage capacitor. A bit line sense amplifier may be coupled to a memory cell of the memory cell array. The bit line sense amplifier may receive a first source voltage as a cell array internal voltage in a write operation. A word line may receive a second source voltage as a voltage to drive the access transistor of the memory cell. The second source voltage may be higher than the first source voltage. A write path circuit may receive the second source voltage to drive write data into an input/output line in a write operating mode.

At least one other example embodiment provides a method of supplying a power supply voltage in a semiconductor memory device. According to at least this method, a first source voltage may be applied as an internal voltage for operating a core circuit. A second source voltage may be applied as a drive voltage for driving the core circuit. The second source voltage may also be applied as a drive voltage for driving a write path circuit. The second source voltage may drive write data into an input/output line in a write operating mode and the second source voltage may be greater than the first source voltage.

At least one other example embodiment provides a semiconductor memory device. According to at least this example embodiment, a core circuit may be configured to operate in response to a first source voltage applied as an internal voltage and a second source voltage applied as a drive voltage. A write path circuit may be configured to operate in response to the second source voltage applied as a drive voltage. The second source voltage may drive write data into an input/output line of the write path circuit in a write operating mode, and the second source voltage may be greater than the first source voltage.

BRIEF DESCRIPTION OF THE DRAWINGS

Example embodiments will become more apparent by describing the accompanying drawings in which like reference characters refer to the same parts throughout the different views, in which.

DETAILED DESCRIPTION OF EXAMPLE EMBODIMENTS

Figure 1:
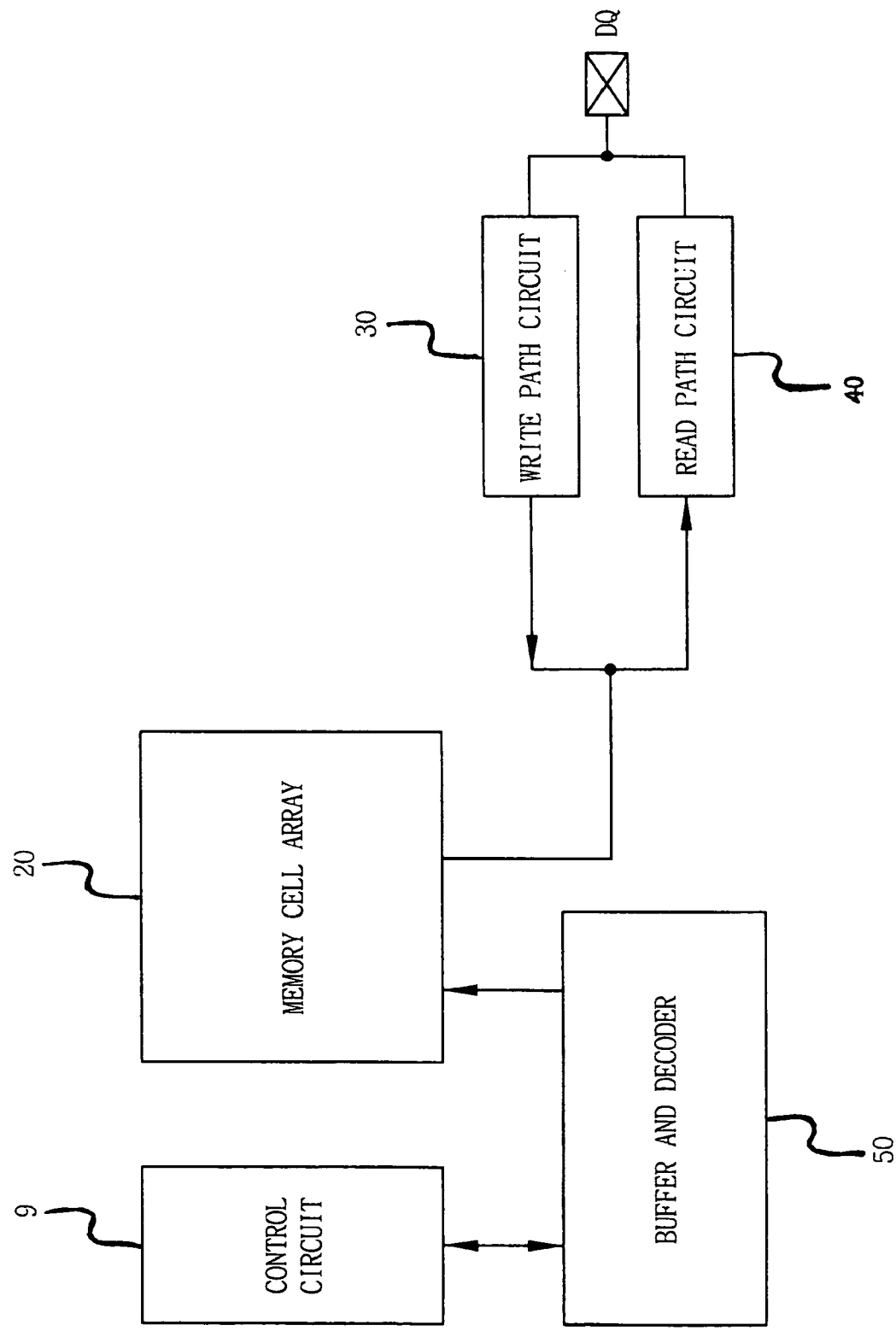
FIG. 1 is a block diagram of a conventional semiconductor memory device.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 3:
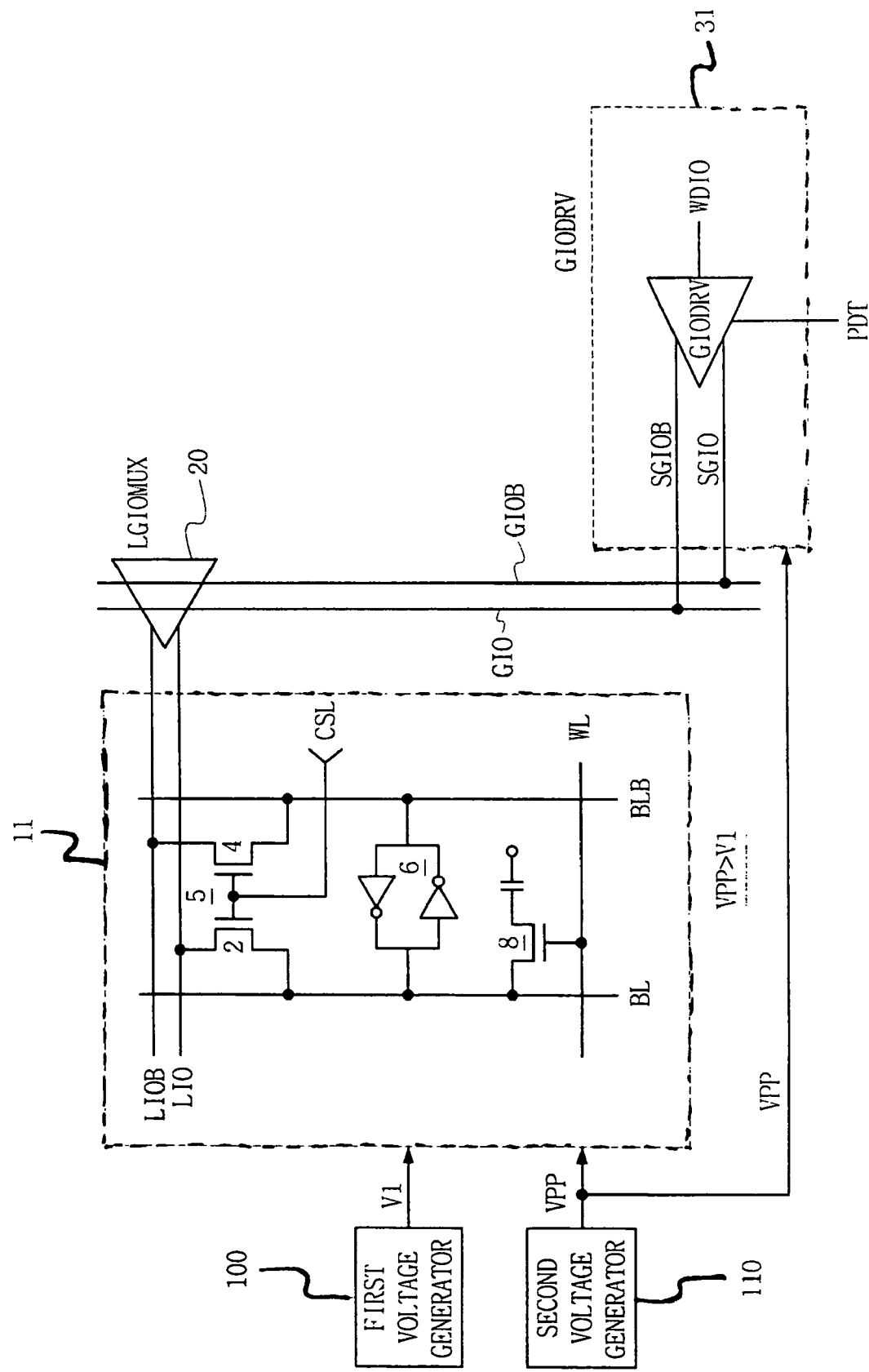
FIG. 3 is a circuit diagram illustrating a portion of a semiconductor memory device according to an example embodiment.
Figure 4:
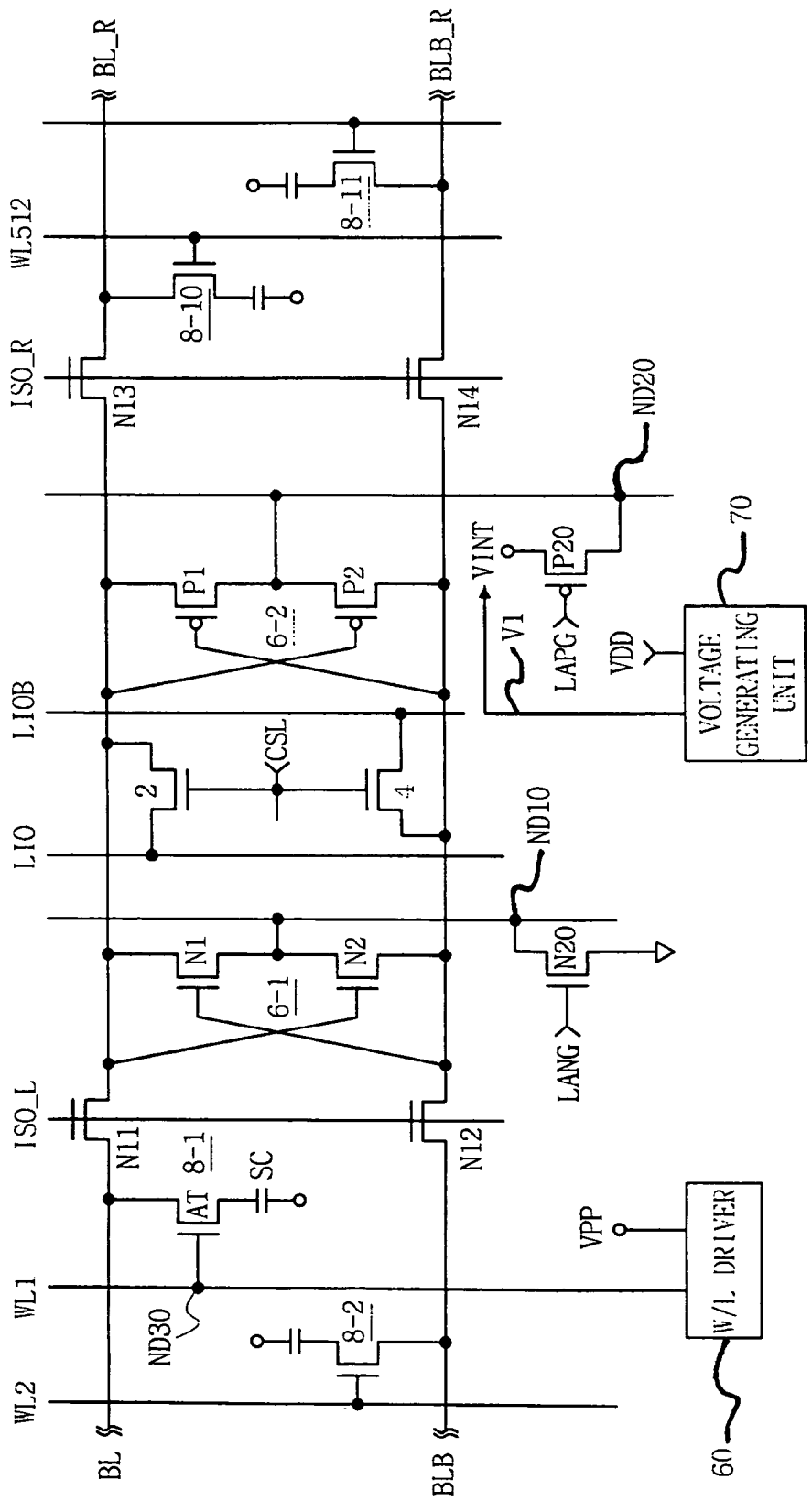
FIG. 4 is a circuit diagram illustrating a memory cell array circuit according to an example embodiment.
Figure 5:
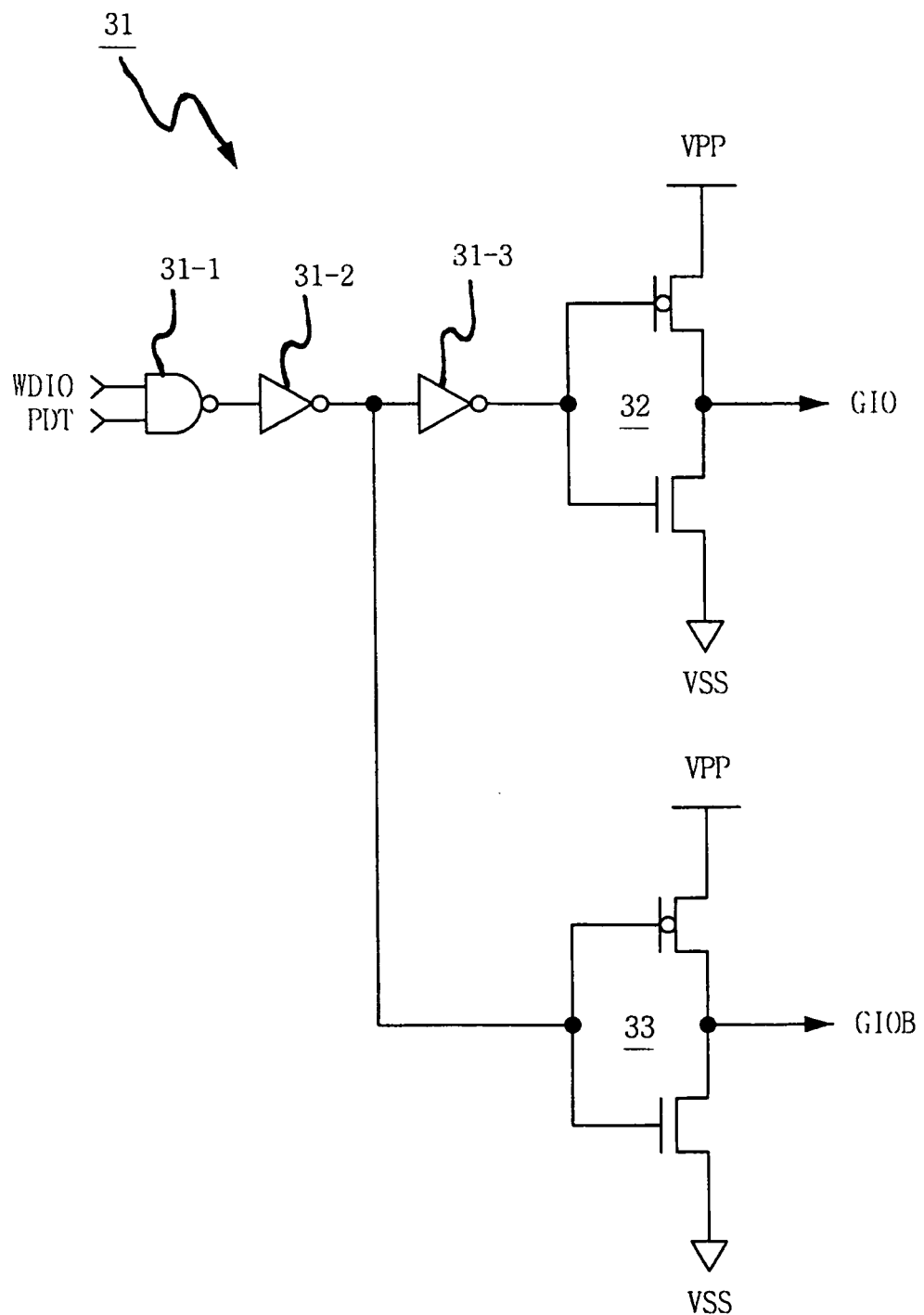
FIG. 5 is a circuit diagram of an input/output driver according to an example embodiment.
Figure 6:
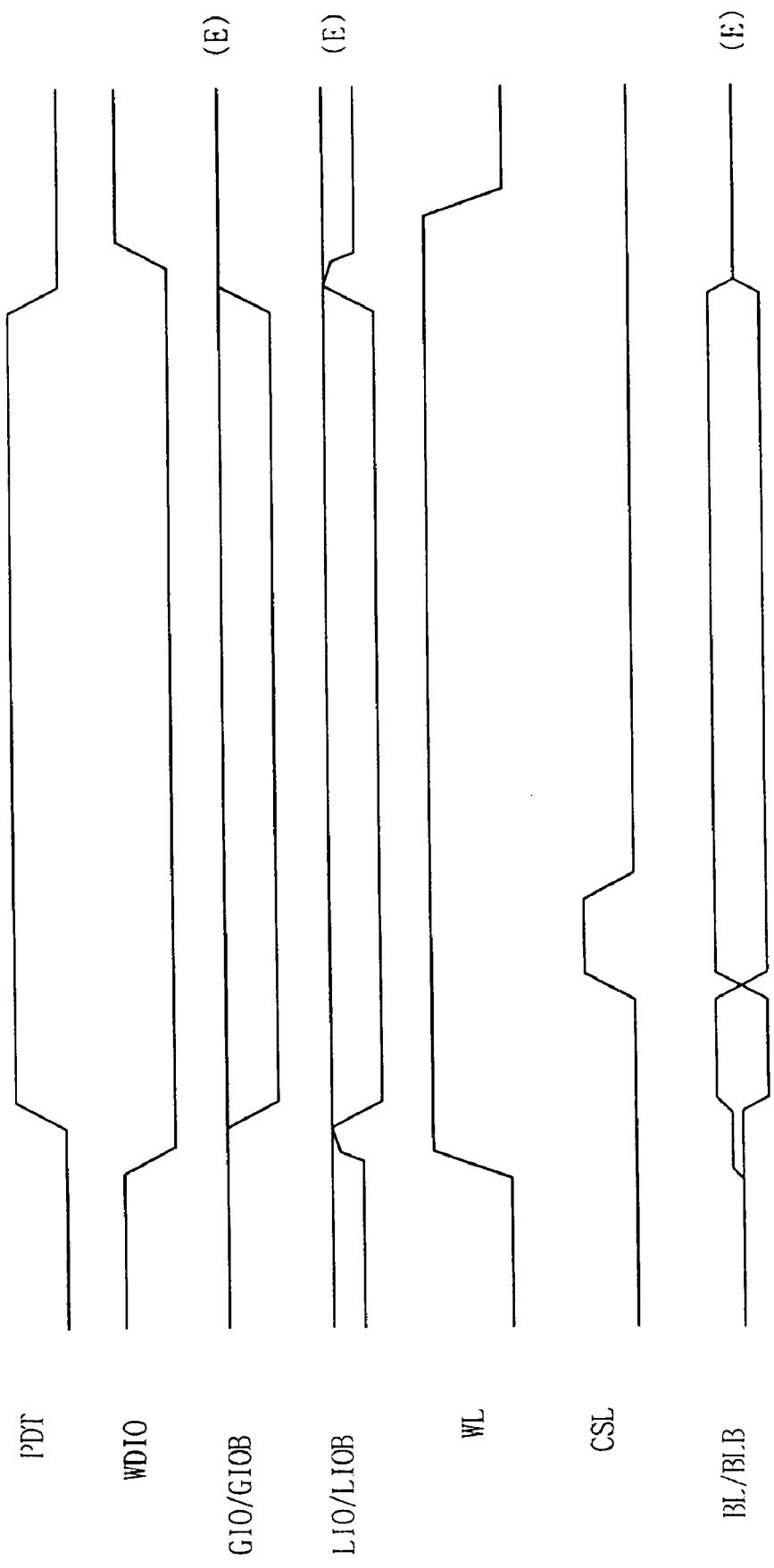
FIG. 6 illustrates example timings of signals according to example embodiments.
Figure 7:
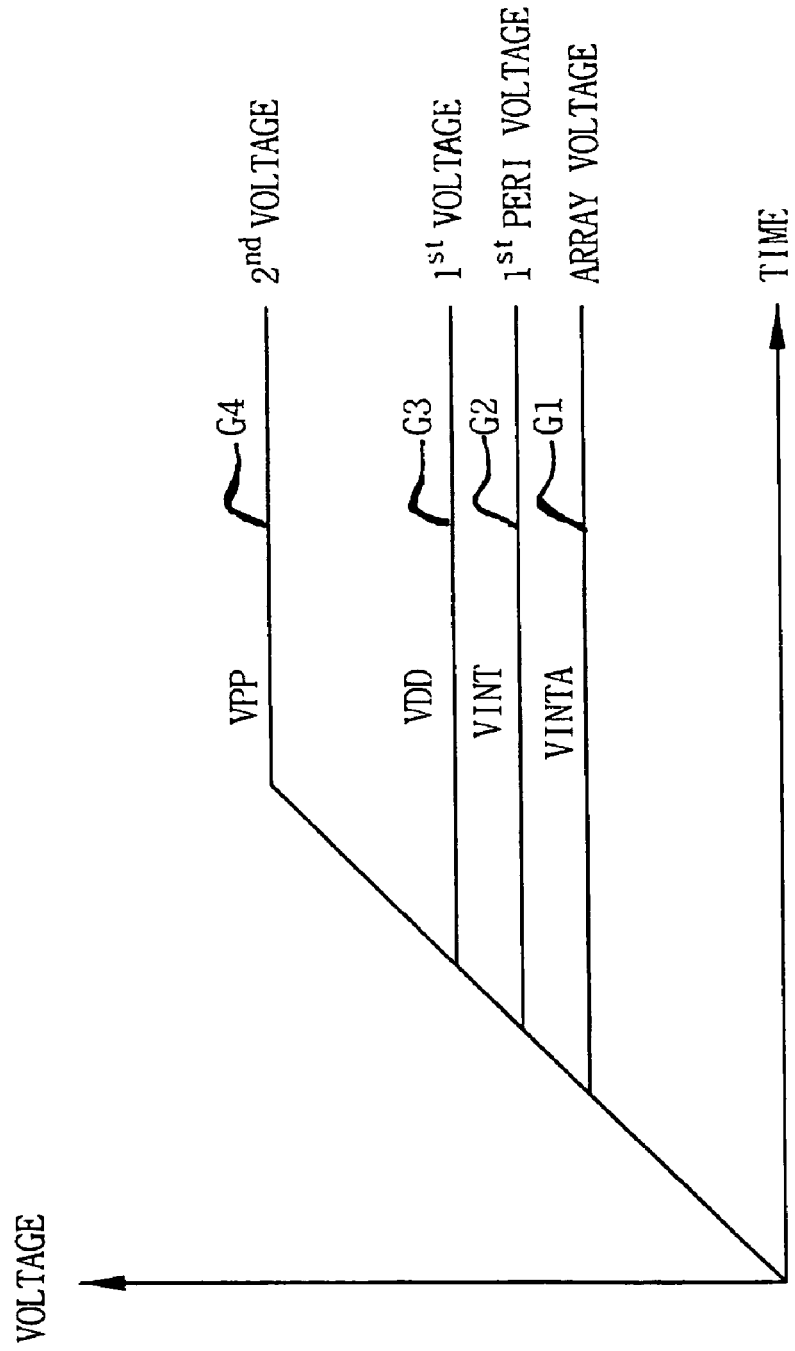
FIG. 7 is a graph of power supply voltages in accordance with example embodiments.

FIG. 3 is a circuit diagram illustrating a portion of a semiconductor memory device according to an example embodiment. FIG. 4 is a circuit diagram illustrating a memory cell array circuit according to an example embodiment. FIG. 5 is a circuit diagram of an input/output driver according to an example embodiment. FIG. 6 illustrates example timings of signals according to example embodiments. FIG. 7 is a graph of power supply voltages in accordance with example embodiments.

Figure 2:
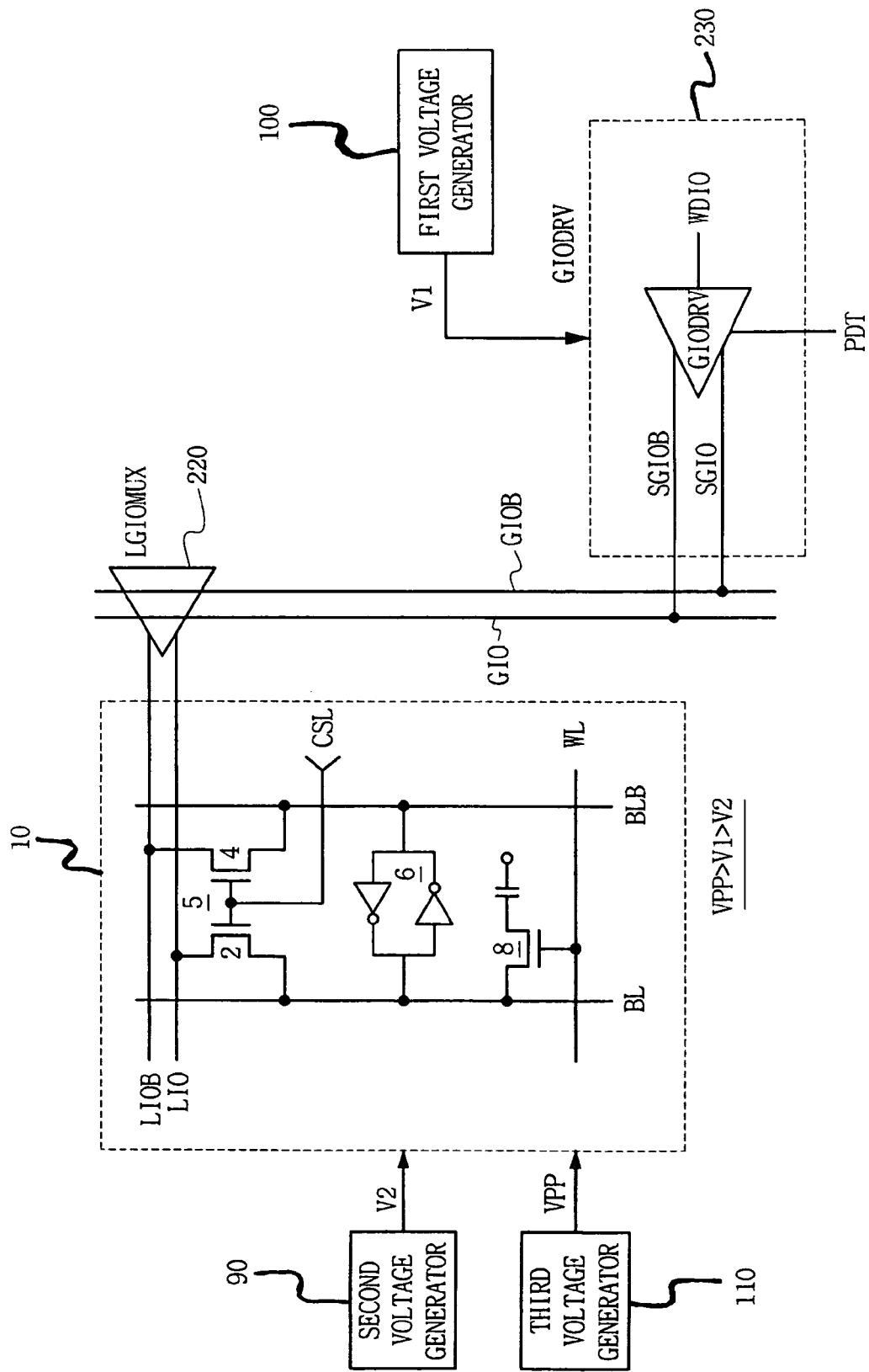
FIG. 2 is a circuit diagram illustrating a portion of the semiconductor memory device in FIG. 1.

Referring to FIG. 3, the portion shown may be referred to as an internal voltage generating circuit. The internal voltage generating circuit may include a first voltage generator 100. The first voltage generator 100 may apply a cell array voltage V1 to a sense amplifier 6 of a cell core circuit 11. A voltage level of the cell array voltage V1 may be higher than a voltage level of cell array voltage V2 of FIG. 2. The internal voltage generating circuit may further include second voltage generator 110. The second voltage generator 110 may apply a high voltage VPP to a word line WL coupled to an access transistor of a memory cell 8. The second voltage generator 110 may also apply the voltage VPP to a global input/output driver 31 of a write path circuit. A voltage level of the cell array voltage V1 may be lower than a level of the high voltage VPP. Because the cell array voltage V1 is lower than voltage VPP (also referred to as a peripheral circuit voltage), reliability and/or write speed may improve.

According to example embodiments, a cell array voltage and/or threshold voltage limits of memory cell transistor 8 may be lowered more easily. Furthermore, cell array voltages may increase as compared with the conventional DRAM shown in FIG. 2. Thus, a memory cell drive capability of sense amplifier may increase. This may also improve write speeds.

An applied power supply voltage according to an example embodiment is described as follows with reference to FIG. 7.

Referring to FIG. 7, a transverse (x-) axis represents time and a longitudinal (y-) axis represents voltage. Graph G3 designates an external voltage VDD, and graphs G1 and G2 designate internal voltages. Graph G4 represents an internal high voltage or second external voltage.

According to at least one example embodiment, a voltage corresponding to graph G2 may also be applied to sense amplifier 6 as the cell array voltage V1. Voltage corresponding to the graph G2 may also be applied as a peripheral circuit voltage to a peripheral circuit.

Voltage VPP corresponding to graph G4 may be applied to global input/output driver 31 of write path circuit as a driver operating voltage. In the conventional art, an array voltage VINTA corresponding to graph G1 may be applied as a cell array voltage, whereas an internal voltage VINT corresponding to graph G2 may be applied as the peripheral voltage. According to example embodiments, however, a source voltage having a relatively high level as compared to the conventional art may be used as cell array voltage and simultaneously as peripheral circuit voltage. The high voltage VPP may be a driving voltage for the global input/output driver of the write path circuit. The high voltage VPP may be generated internally or applied externally. Voltage VPP may have the same or substantially the same level as a voltage applied to a word line WL connected to a selected memory cell.

FIG. 4 is a circuit diagram illustrating a memory cell array circuit according to an example embodiment. As shown, a unit memory cell 8-1 may include an access transistor AT and a storage capacitor SC. A bit line BL and a complementary bit line BLB may constitute one pair of bit lines. In the memory cell 8-1, a drain of the access transistor AT may be coupled to the bit line BL, and a gate of the access transistor AT may be coupled to a word line WL1. When the memory cell 8-1 is accessed, the word line WL1 may receive the high voltage VPP from word line driver 60.

An N-type sense amplifier 6-1 and a P-type sense amplifier 6-2 may constitute the bit line sense amplifier 6 shown in FIG. 3. Although example embodiments will be described herein with regard to an N-type sense amplifier 6-1 and a P-type sense amplifier 6-2, the sense amplifiers may be interchangeable. An operating voltage of a sense amplifier driver P20 may be applied to drive the P-type sense amplifier 6-2. The operating voltage may have a voltage level corresponding to graph G2 of FIG. 7.

An operating voltage applied to a source of the sense amplifier driver P20 may be the cell array voltage VINT. In the conventional art, a source voltage VINTA corresponding to graph G1 of FIG. 7 may be applied as a cell array voltage. In example embodiments, however, a drive capability of the sense amplifier driver P20 may increase in a write operation, and thus, a potential of drive node ND20 may have a relatively high level as compared to the conventional art. Thus, a pull-up capability of the P-type sense amplifier 6-2 may increase. An increase in the pull-up capability of the P-type sense amplifier 6-2 may increase a level of write data written to a memory cell to a relatively high level as compared to the conventional art. Accordingly, write speed and/or reliability may increase in relatively higher integrated semiconductor memory devices.

A voltage generating circuit 70 shown in FIG. 4 may be an internal voltage generator for use in a peripheral circuit. The voltage generating circuit 70 may receive external voltage VDD and generate internal voltage VINT. The internal voltage VINT may have a level lower than the external voltage.

The internal voltage generator 70 may include a differential amplifier (e.g., a current mirror type differential amplifier) constructed of PMOS and/or NMOS transistors, and a control driver for controlling the differential amplifier. The internal voltage generator 70 may compare a reference voltage VREF output from a reference voltage generator with internal voltage VINT to generate the internal voltage VINT having a level in accordance with or traced to the reference voltage VREF.

In FIG. 4, NMOS transistors 2 and 4 having gates coupled to a column selection line CSL correspond to a column selection gate 5 of FIG. 3. Isolation transistors N11 and N12 may electrically isolate memory cells 8-1, 8-2 and sense amplifier 6-1 in response to an isolation signal ISO_L. The isolation transistors N13 and N14 may electrically isolate memory cells 8-10, 8-11 and sense amplifier 6-2 in response to isolation signal ISO_R. The structure of cell core circuit shown in FIG. 4 may be changed to other circuit structures as desired.

FIG. 5 illustrates a global input/output driver according to an example embodiment. The global input/output driver of FIG. 5 may serve as the global input/output driver 31 of FIG. 3 and is described in more detail.

Referring to FIG. 5, a NAND gate 31-1 may perform a NAND operation on received write data WDIO and a driver enable signal PDT to generate a NAND response signal. Inverters 31-2 and 31-3 may be sequentially coupled with an output of the NAND gate 31-1. Output inverters 32 and 33 may be arranged and coupled as illustrated in FIG. 5. The inverter 31-2 may invert the NAND response signal and output the inverted NAND response signal to the inverter 31-3 and output inverter 33. The inverter 31-3 may invert the inverted NAND response and output the result to the output inverter 32.

The second source voltage VPP may be applied as a drive voltage of the global input/output line driver 31 to drive write data into global input/output line GIO, GIOB in a write operating mode. For example, the second source voltage VPP may be provided as operating voltage of the output inverters 32 and 33. As a result, peripheral circuit voltage having the same level as the cell array voltage may be used for peripheral circuits, while a voltage higher than the cell array voltage may be applied to a write path circuit in the write operation so that a voltage higher than the cell array voltage is applied to the peripheral circuits, thereby writing data to a cell without any problems.

In a read operation, the cell array voltage and a power supply voltage may be the same or substantially the same. In the conventional art, a voltage level corresponding to graph G2 of FIG. 7 may be applied as an operating voltage of the output inverters 32 and 33. In example embodiments, however, a higher voltage level, (e.g., a 2-level higher) may be applied as operating voltage of the global input/output line driver.

FIG. 6 illustrates example timings of signals related to the example embodiment shown in FIG. 3.

Referring to FIG. 6, waveforms PDT, WDIO, GIO/GIOB, LIO/LIOB, WL, CSL and BL/BLB are each shown on a single axis representing time. The waveform PDT represents an enable signal of the global input/output line driver 31, and the waveform WDIO represents a level of write data applied to the global input/output line driver 31 of FIG. 3. The waveform GIO/GIOB represents a potential of a global input/output line pair GIO, GIOB. The waveform LIO/LIOB represents a potential of a local input/output line pair LIO, LIOB. The waveform WL represents a potential of a selected word line, and the waveform CSL represents a gating signal applied to a column selection gate 5. The waveform BL/BLB represents a potential of bit line pair BL, BLB of FIG. 3.

As shown in FIG. 6, a voltage level of the waveforms GIO/GIOB, LIO/LIOB and BL/BLB has a higher level through a voltage applying method as compared to the conventional art. In FIG. 6, waveforms are shown with a reference character E at a right side of the drawing for discriminating between example embodiments and the conventional art. As shown, a potential difference between bit line pairs increases in the write operation, thereby providing increased reliability and/or a higher write speed.

An example embodiment of a method in which write data WDIO applied to the global input/output line driver 31 may be written to memory cell 8 of FIG. 3 will now be described. In at least this example, write data WDIO may be received through an input buffer. The received write data WDIO may be applied to the global input/output line driver 31 through a DIO line driver. The write data WDIO may be driven by the global input/output line driver 31 using the high voltage VPP as an operating voltage when the enable signal PDT transitions to a high level (e.g., a logic high level).

The write data WDIO may be transferred to the global input/output line pair GIO/GIOB through a sub global input/output line pair SGIO/SGIOB. The write data WDIO may have a potential as shown by waveform GIO/GIOB of FIG. 6. Write data having the potential as shown by the waveform GIO/GIOB may be transferred to local input/output line pair LIO, LIOB through a local global input/output line multiplexer 20 when transistors constituting a multiplexer turn on.

A logic level of the column selection signal CSL may be at a high state or high logic level. As a result, column selection gate 2, 4 may turn on, and write data of the local input/output line pair LIO, LIOB may be transferred to a corresponding bit line pair BL, BLB. The write data transferred to the bit line pair BL, BLB may be stored at a storage capacitor of the memory cell 8 through sense amplifier 6. In this example, as in waveform BL/BLB of FIG. 6, a potential of the bit line pair BL, BLB may also be increased as compared to the conventional art. For example, an amount of charge stored at the storage capacitor may increase relative to the conventional art.

Accordingly, cell array voltage and/or peripheral circuit voltage may have the same or substantially the same voltage level and a portion of write path circuit may utilize a relatively high voltage applied internally and/or externally. As a result, the cell array voltage in a more highly integrated semiconductor memory device may be lowered, reliability and/or operating speeds may increase.

As described above, in power supply methods and semiconductor memory devices according to example embodiments, cell array voltage may be lowered, reliability and/or operating speeds may increase.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. For example, an external voltage and internal voltage applying method may be changed diversely, and furthermore details in the configuration of global input/output line driver in a write path circuit to receive a second external voltage as an operating voltage may be varied. Accordingly, these and other changes and modifications are seen to be within the true spirit and scope of the present invention as defined by the appended claims.

In the drawings and specification, there have been disclosed typical embodiments of the present invention and, although specific terms are employed, they are used in a generic and descriptive sense only and not for purposes of limitation, the scope of the present invention being set forth in the following claims.

What is claimed is:

1. A method of supplying a power supply voltage in a semiconductor memory device, the method comprising:
    applying a first source voltage as an internal voltage for operating a core circuit;
    applying a second source voltage as a drive voltage for driving the core circuit; and
    applying the second source voltage as a drive voltage for driving a write path circuit, the second source voltage driving write data into an input/output line in a write operating mode, and the second source voltage being greater than the first source voltage, wherein
    the first source voltage is applied as a cell array internal voltage for operating a sense amplifier coupled to a memory cell of a memory cell array included in the core circuit, and
    the second source voltage is applied as a word line drive voltage to a word line of the memory cell array.

2. The method of claim 1, wherein the second source voltage is applied as a drive voltage of an input/output line driver included in the write path circuit.

3. The method of claim 2, wherein the second source voltage is an external voltage applied by an external source.

4. The method of claim 2, wherein the second source voltage is an internal voltage generated by a high voltage pumping circuit.

5. The method of claim 2, wherein the input/output line driver is a global input/output line driver.

6. The method of claim 2, wherein the first source voltage is less than a voltage level of a first external voltage, and the second source voltage has a voltage level corresponding to the voltage level of a second external voltage, the second external voltage being greater than the first external voltage.

7. The method of claim 6, wherein the second source voltage is an internal voltage generated by a high voltage pumping circuit.

8. The method of claim 7, wherein the input/output line driver is a global input/output line driver.

9. The method of claim 1, further including,
    applying the first source voltage to a peripheral circuit block, wherein
    the first source voltage has a voltage level lower than a first external voltage, and
    the second source voltage is an external voltage having a voltage level higher than a voltage level of the first external voltage.

10. The method of claim 9, wherein the first source voltage is an internal voltage generated based on the first external voltage.

11. The method of claim 10, wherein the write path circuit includes a global input/output line driver.

12. A semiconductor memory device, comprising:
a core circuit configured to operate in response to a first source voltage applied as an internal voltage and a second source voltage applied as a drive voltage; and
a write path circuit configured to operate in response to the second source voltage applied as a drive voltage, the second source voltage driving write data into an input/output line of the write path circuit in a write operating mode, the second source voltage being greater than the first source voltage, wherein
the first source voltage is applied as a cell array internal voltage for operating a sense amplifier coupled to a memory cell of a memory cell array included in the core circuit, wherein the core circuit further includes,
a word line configured to receive the second source voltage as a driving voltage for driving the access transistor of the memory cell.

13. The semiconductor memory device of claim 12, wherein the core circuit further includes,
the memory cell array having a plurality of memory cells arranged in a matrix of rows and columns, each of the plurality of memory cells including an access transistor and a storage capacitor,
a bit-line sense amplifier coupled to each memory cell of the memory cell array, the bit line sense amplifier being configured to operate in response to the first source voltage received as a cell array internal voltage in a write operation, and
the second source voltage having a voltage level higher than a voltage level of the first source voltage.

14. The device of claim 13, wherein the second source voltage is an external voltage.

15. The device of claim 13, wherein the second source voltage is an internal voltage generated by a high voltage pumping circuit.

16. The device of claim 13, wherein the write path circuit is a global input/output line driver.

17. The semiconductor memory device of claim 12, wherein the first source voltage is generated based on an external voltage.

18. The semiconductor memory device of claim 12, wherein the second source voltage is applied as a drive voltage of an input/output line driver included in the write path circuit.

19. The semiconductor memory device of claim 18, wherein the second source voltage is an external voltage applied by an external source.

20. The semiconductor memory device of claim 18, wherein the first source voltage is less than a voltage level of a first external voltage, and the second source voltage has a voltage level corresponding to the voltage level of a second external voltage, the second external voltage being greater than the first external voltage.

* * * * *